United States Patent
Hong et al.

(10) Patent No.: US 12,490,502 B2
(45) Date of Patent: Dec. 2, 2025

(54) BIPOLAR JUNCTION TRANSISTORS AND P-N JUNCTION DIODES INCLUDING STACKED NANO-SEMICONDUCTOR LAYERS

(71) Applicant: Samsung Electronics Co., Ltd., Suwon-si (KR)

(72) Inventors: Byounghak Hong, Albany, NY (US); Gunho Jo, Clifton Park, NY (US); Sooyoung Park, Clifton Park, NY (US); Hyoeun Park, Cohoes, NY (US); WookHyun Kwon, Hwaseong-si (KR); Jaehong Lee, Albany, NY (US); Kang-ill Seo, Albany, NY (US)

(73) Assignee: Samsung Electronics Co., Ltd. (KR)

( * ) Notice: Subject to any disclaimer, the term of this patent is extended or adjusted under 35 U.S.C. 154(b) by 544 days.

(21) Appl. No.: 17/936,127

(22) Filed: Sep. 28, 2022

(65) Prior Publication Data

US 2023/0361112 A1    Nov. 9, 2023

Related U.S. Application Data

(60) Provisional application No. 63/355,872, filed on Jun. 27, 2022, provisional application No. 63/338,071, filed on May 4, 2022.

(51) Int. Cl.
*H10D 84/60* (2025.01)
*H10D 8/00* (2025.01)
(Continued)

(52) U.S. Cl.
CPC ........... *H10D 84/619* (2025.01); *H10D 8/422* (2025.01); *H10D 10/60* (2025.01); *H10D 62/121* (2025.01)

(58) Field of Classification Search
CPC .. H10D 30/014; H10D 62/134; H10D 62/115; H10D 62/137; H10D 8/00;
(Continued)

(56) References Cited

U.S. PATENT DOCUMENTS 9,991,254 B1   6/2018  Cheng et al.
10,825,915 B2  11/2020 Lee et al.
(Continued)

FOREIGN PATENT DOCUMENTS

CN     112530872 A  *  3/2021  ......... H01L 21/0245

*Primary Examiner* — Shahed Ahmed
(74) *Attorney, Agent, or Firm* — Myers Bigel, P.A.

(57) ABSTRACT

Integrated circuit devices including a bipolar junction transistor (BJT) and/or a P-N junction diode are provided. The integrated circuit devices may include a first stack including first and second semiconductor regions that are spaced apart from each other in a horizontal direction and have a first conductivity type and a plurality of nano-semiconductor layers that are stacked in a vertical direction and are between the first and second semiconductor regions. The plurality of nano-semiconductor layers each have a second conductivity type, and the first semiconductor region may include a side surface facing the plurality of nano-semiconductor layers. The integrated circuit device may also include a vertical semiconductor layer having the second conductivity type and a conductive contact that contacts the plurality of nano-semiconductor layers. The vertical semiconductor layer may contact the side surface of the first semiconductor region and the plurality of nano-semiconductor layers.

20 Claims, 6 Drawing Sheets

(51) Int. Cl.
*H10D 10/60* (2025.01)
*H10D 62/10* (2025.01)

(58) Field of Classification Search
CPC .............. H10D 84/403; H10D 10/061; H10D 30/6735; H10D 84/401; H10D 84/811; H10D 62/118; H10D 10/00–891; H10D 84/0107–0109; H10D 89/711–713; H10D 84/611–619; H10D 30/501–509; H10D 8/411; H10D 8/422
See application file for complete search history.

(56) References Cited

U.S. PATENT DOCUMENTS

| | | |
|---|---|---|
| 11,164,792 B2 | 11/2021 | Xie et al. |
| 11,205,711 B2 | 12/2021 | Wang et al. |
| 11,289,591 B1 | 3/2022 | Su et al. |
| 2022/0113199 A1 | 4/2022 | Su et al. |
| 2022/0157994 A1 | 5/2022 | Chen et al. |
| 2023/0275083 A1* | 8/2023 | Malinowski ....... H10D 30/6735 257/350 |

* cited by examiner

BIPOLAR JUNCTION TRANSISTORS AND P-N JUNCTION DIODES INCLUDING STACKED NANO-SEMICONDUCTOR LAYERS

CROSS-REFERENCE TO RELATED APPLICATIONS

This application claims priority to U.S. Provisional Application Ser. No. 63/338,071 entitled INTEGRATED CIRCUIT DEVICES INCLUDING JUNCTION DEVICES AND BACKSIDE POWER DELIVERY NETWORK AND METHODS OF FORMING THE SAME, filed in the USPTO on May 4, 2022, and to U.S. Provisional Application Ser. No. 63/355,872 entitled NANOSHEET DIODE AND BIPOLAR JUNCTION TRANSISTOR FOR 3D SFET WITHOUT INNER SPACER STRUCTURE, filed in the USPTO on Jun. 27, 2022, the disclosures of which are hereby incorporated by reference herein in their entireties.

BACKGROUND

The present disclosure generally relates to the field of integrated circuit devices and, more particularly, to three-dimensional integrated circuit devices that include stacked transistors.

Various structures of an integrated circuit device and methods of forming the same have been proposed to simplify the middle-of-line (MOL) portion and/or the back-end-of-line (BEOL) portion of device fabrication so as to increase the integration density of the device. For example, a back side power distribution network (BSPDN) may simplify the MOL portion and the BEOL portion of device fabrication.

SUMMARY

An integrated circuit devices according to some embodiments may include a bipolar junction transistor (BJT) and/or a P-N junction diode. The integrated circuit devices may include a first stack including first and second semiconductor regions that are spaced apart from each other in a horizontal direction and have a first conductivity type and a plurality of nano-semiconductor layers that are stacked in a vertical direction and are between the first and second semiconductor regions. The plurality of nano-semiconductor layers each have a second conductivity type, and the first semiconductor region may include a side surface facing the plurality of nano-semiconductor layers. The integrated circuit device may also include a vertical semiconductor layer having the second conductivity type and a conductive contact that contacts the plurality of nano-semiconductor layers. The vertical semiconductor layer may contact the side surface of the first semiconductor region and the plurality of nano-semiconductor layers. In some embodiments, the first stack may include the BJT or the P-N junction diode, and the first stack is stacked with a dummy element.

DETAILED DESCRIPTION

A single integrated circuit device (e.g., a single chip) may include stacked field-effect transistors (FETs) as well as a bipolar junction transistor (BJT) and a P-N junction diode. For example, a temperature sensing element or an electrostatic discharging element may include a BJT and/or a P-N junction diode. Each of a BJT and a P-N junction diode includes at least two regions having opposite conductivity types, and those two regions can be formed in a substrate when the substrate is thick enough to arrange those two regions in a thickness direction of the substrate. A substrate of an integrated circuit device may be thinned to include a BSPDN, and a thickness of the substrate may not be thick enough to form a BJT and a P-N junction diode therein.

According to some embodiments, elements of a BJT (e.g., an emitter, a collector and a base) and elements of a P-N junction diode (e.g., an anode region and a cathode region) may be formed on a substrate, rather than in the substrate. Accordingly, a BJT and a P-N junction diode can be formed in an integrated circuit device even when the substrate is thinned to include a BSPDN. Further, those elements of a BJT and a P-N junction diode may be formed concurrently with elements (e.g., channel layers and/or source/drain regions) of stacked FETs using some of the same fabrication processes. Therefore, elements of a BJT and a P-N junction diode may be formed without significantly increasing a number of fabrication processes.

Example embodiments will be described in greater detail with reference to the attached figures.

Figure 1:
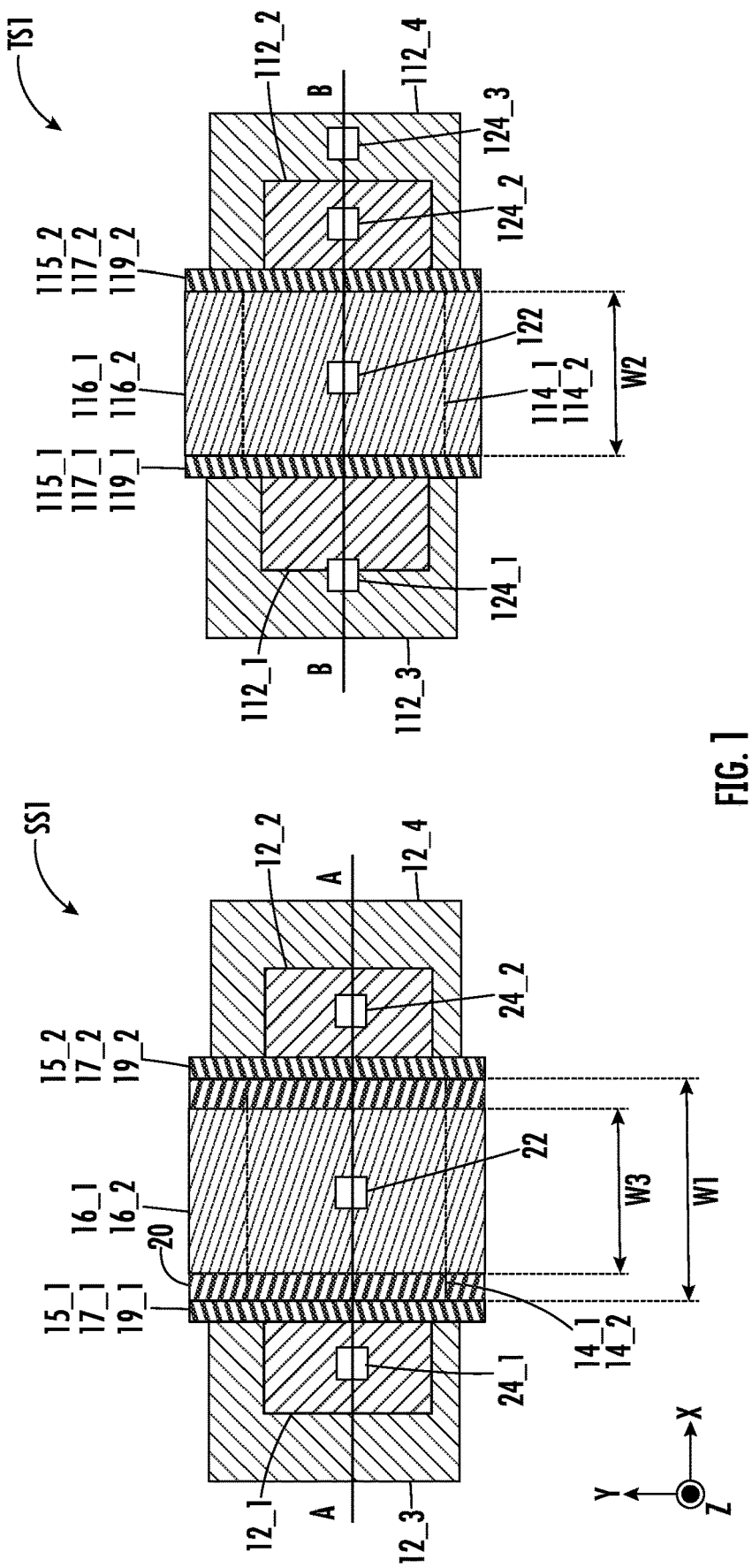
FIG. 1 is a layout of an integrated circuit device according to some embodiments.
Figure 2:
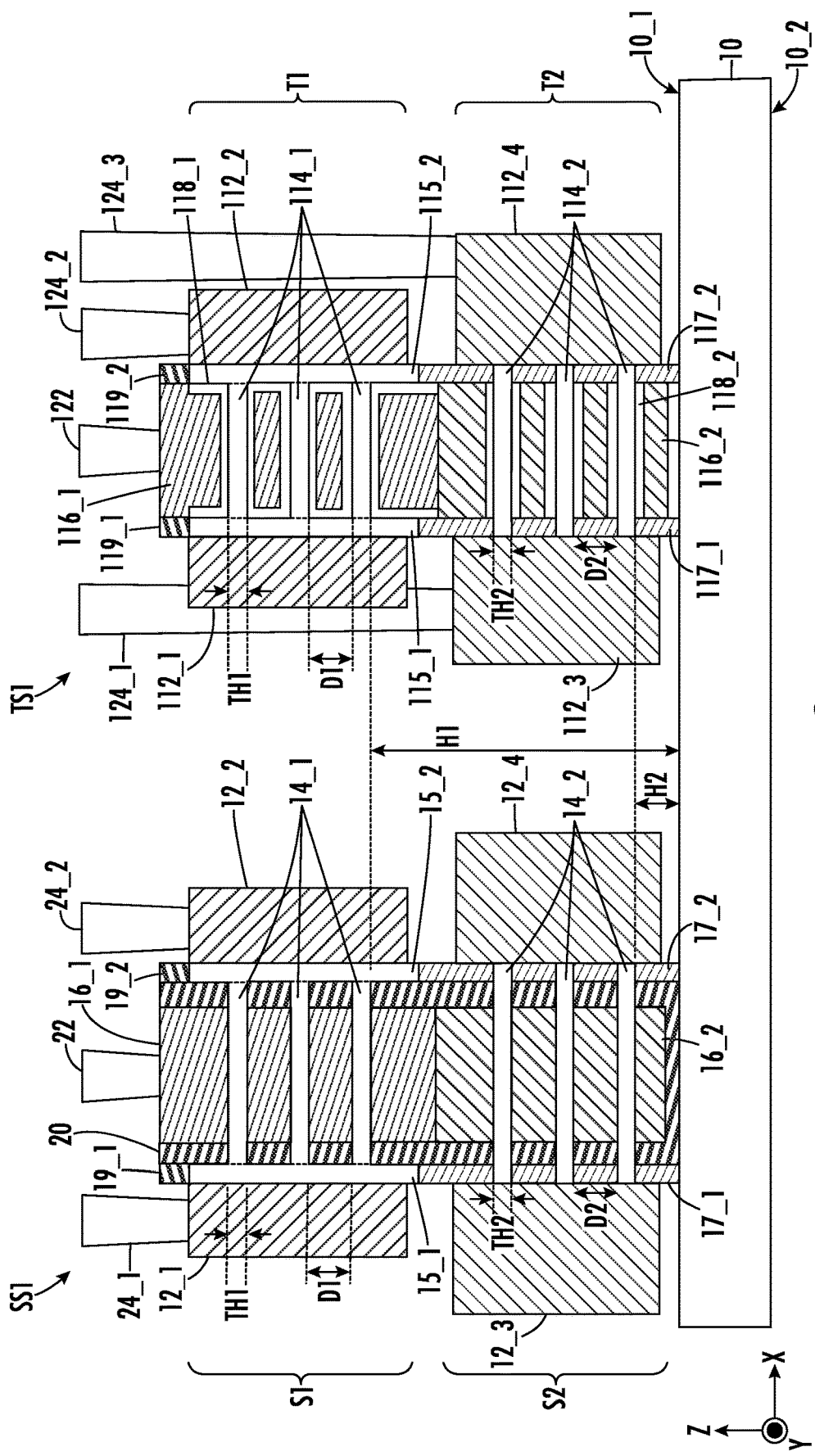
FIG. 2 shows cross-sectional views taken along the lines A-A and B-B in FIG. 1, according to some embodiments.

FIG. 1 is a layout of an integrated circuit device including a first stacked structure SS1 and a first transistor structure TS1, according to some embodiments. FIG. 2 shows a cross-sectional view of the first stacked structure SS1 taken along the line A-A in FIG. 1 and a cross-sectional view of the first transistor structure TS1 taken along the line B-B in FIG. 1, according to some embodiments.

Although FIG. 1 illustrates that the first stacked structure SS1 and the first transistor structure TS1 are spaced apart from each other in a first direction X (also referred to as a first horizontal direction), the first stacked structure SS1 and the first transistor structure TS1 may be spaced apart from each other in any direction. For example, the first stacked structure SS1 and the first transistor structure TS1 may be spaced apart from each other in a second direction Y (also referred to as a second horizontal direction). In some embodiments, the first direction X and the second direction Y may be perpendicular to each other.

Referring to FIGS. 1 and 2, the first stacked structure SS1 and the first transistor structure TS1 may be provided on a first surface 10_1 (also referred to as an upper surface) of a substrate 10, and thus the first surface 10_1 of the substrate 10 may face the first stacked structure SS1 and the first transistor structure TS1. The substrate 10 may also include a second surface 10_2 (also referred to as a lower surface) that is opposite the first surface 10_1. In some embodiments, the first surface 10_1 and the second surface 10_2 of the substrate 10 may be parallel to each other. The first direction X and/or the second direction Y may be parallel to the first surface 10_1.

The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate. For example, the substrate 10 may be a silicon wafer.

The first stacked structure SS1 may include a first stack S1 including first nano-semiconductor layers 14_1 stacked in a third direction Z (also referred to as a vertical direction) and may include a second stack S2 including second nano-semiconductor layers 14_2 stacked in the third direction Z. The third direction Z may be perpendicular to both the first direction X and the second direction Y.

The first stack S1 may also include first and second semiconductor regions 12_1 and 12_2 that may be spaced apart from each other in the first direction X and may have a first conductivity type (e.g., p-conductivity type or n-conductivity type). The first nano-semiconductor layers 14_1 may have a second conductivity type that is different from the first conductivity type and may include respective first side surfaces facing the first semiconductor region 12_1 and respective second side surfaces facing the second semiconductor region 12_2.

Further, the first stack S1 may include first and second vertical semiconductor layers 15_1 and 15_2 that may have the second conductivity type. The first vertical semiconductor layer 15_1 may contact the first semiconductor region 12_1, and thus the first vertical semiconductor layer 15_1 and the first semiconductor region 12_1 may form a P-N junction. When the first vertical semiconductor layer 15_1 is not provided, the first nano-semiconductor layers 14_1 contact the first semiconductor region 12_1 to form a P-N junction. As illustrated in FIG. 2, an interface between the first vertical semiconductor layer 15_1 and the first semiconductor region 12_1 may have a length, in the third direction Z, that may be much longer than the sum of a thickness (e.g., a first thickness TH1 in FIG. 2) of each of the first nano-semiconductor layers 14_1. Accordingly, the first vertical semiconductor layer 15_1 may increase a length of an interface, in the third direction Z, between a p-type region and an n-type region forming a P-N junction, and an electrical current flowing through that interface may increase. The first vertical semiconductor layer 15_1 may also contact the first nano-semiconductor layers 14_1 (e.g., the first side surfaces of the first nano-semiconductor layers 14_1).

The second vertical semiconductor layer 15_2 may contact the second semiconductor region 12_2 and thus may form a P-N junction. The second vertical semiconductor layer 15_2 may also contact the first nano-semiconductor layers 14_1 (e.g., the second side surfaces of the first nano-semiconductor layers 14_1). Similar to the first vertical semiconductor layer 15_1, the second vertical semiconductor layer 15_2 may increase a length of an interface, in the third direction Z, between a p-type region and an n-type region forming a P-N junction, and an electrical current flowing through that interface may increase.

In some embodiments, the first nano-semiconductor layers 14_1 and the first and second vertical semiconductor layers 15_1 and 15_2 may include the same semiconductor material(s) (e.g., Si, Ge, SiGe, GaP, GaAs, SiC, SiGeC and/or InP). For example, each of the first nano-semiconductor layers 14_1 and the first and second vertical semiconductor layers 15_1 and 15_2 may be a silicon layer. Further, the first nano-semiconductor layers 14_1 and the first and second vertical semiconductor layers 15_1 and 15_2 may include the same dopant (e.g., B, P or As). In some embodiments, a dopant concentration of each of the first nano-semiconductor layers 14_1 and a dopant concentration of each of the first and second vertical semiconductor layers 15_1 and 15_2 may be equal. For example, the dopant concentration of each of the first nano-semiconductor layers 14_1 and the dopant concentration of each of the first and second vertical semiconductor layers 15_1 and 15_2 may be in a range of from $1\times10^{19}$ to $1\times10^{21}$ atoms/cm$^3$.

When the first nano-semiconductor layers 14_1 and the first and second vertical semiconductor layers 15_1 and 15_2 include the same semiconductor material and the same dopant, a visible interface between the first nano-semiconductor layers 14_1 and the first and second vertical semiconductor layers 15_1 and 15_2 may not be present. For simplicity of illustration, however, that interface is shown in FIG. 2 with a dotted line. The first nano-semiconductor layers 14_1 and the first and second vertical semiconductor layers 15_1 and 15_2 may collectively constitute a single region having the second conductivity type.

The first stack S1 may include a first conductive contact 16_1 that may be between the first and second vertical semiconductor layers 15_1 and 15_2 and may contact the first nano-semiconductor layers 14_1 (e.g., middle portions of the first nano-semiconductor layers 14_1 in the first direction X as illustrated in FIG. 2). The first conductive contact 16_1 may be a metallic layer including metal element(s) (e.g., W, Al and/or Cu), and no insulating layer may be present between the first conductive contact 16_1 and the first nano-semiconductor layers 14_1. The first conductive contact 16_1 may be spaced apart from the first and second vertical semiconductor layers 15_1 and 15_2 in the first direction X. In some embodiments, a contact insulator 20 may be provided between the first conductive contact 16_1 and the first and second vertical semiconductor layers 15_1 and 15_2. The contact insulator 20 may also separate the first conductive contact 16_1 from the first vertical semiconductor layer 15_1 and may separate the first conductive contact 16_1 from the second vertical semiconductor layer 15_2. In some embodiments, the first nano-semiconductor layers 14_1 may extend through the first conductive contact 16_1 in the first direction X as illustrated in FIG. 2.

Additionally, the first stack S1 may include a first plug 22 electrically connected to the first conducive contact 16_1 and second and third plugs 24_1 and 24_2 electrically connected to the first and second semiconductor regions 12_1 and 12_2, respectively. In some embodiments, the first plug 22 may contact the first conducive contact 16_1, and the second and third plugs 24_1 and 24_2 may contact the first and second semiconductor regions 12_1 and 12_2, respectively.

In some embodiments, the first nano-semiconductor layers 14_1 and the first and second vertical semiconductor layers 15_1 and 15_2 may collectively be a base of a BJT, the first semiconductor region 12_1 may be an emitter of the BJT, and the second semiconductor region 12_2 may be a collector of the BJT. The first conductive contact 16_1 may be a base contact, the second plug 24_1 may be an emitter contact, and the third plug 24_2 may be a collector contact.

In other embodiments, one of the first and second semiconductor regions 12_1 and 12_2 may be a first conductivity type region of a P-N junction diode, and the first nano-semiconductor layers 14_1 and the first and second vertical semiconductor layers 15_1 and 15_2 may collectively be a second conductivity type region of the P-N junction diode. The first conductive contact 16_1 may be a first terminal (e.g., an anode terminal or a cathode terminal) of the P-N junction diode, and one of the second and third conductive plugs 24_1 and 24_2 may be a second terminal of the P-N junction diode. In some embodiments, the second plug 24_1 may be the second terminal of the P-N junction diode, the third plug 24_2 may be omitted.

The second stack S2 may also include third and fourth semiconductor regions 12_3 and 12_4 that may be spaced apart from each other in the first direction X and may have the second conductivity type. The third and fourth semiconductor regions 12_3 and 12_4 and the first and second semiconductor regions 12_1 and 12_2 may have the different conductivity type. The second nano-semiconductor layers 14_2 may be between the third and fourth semiconductor regions 12_3 and 12_4 and may include respective first side surfaces contacting the third semiconductor region 12_3 and respective second side surfaces contacting the fourth semiconductor region 12_4.

Further, the second stack S2 may include first and second insulating spacers 17_1 and 17_2 that may contact the third and fourth semiconductor regions 12_3 and 12_4 (e.g., side surfaces of the third and fourth semiconductor regions 12_3 and 12_4), respectively. In some embodiments, the second nano-semiconductor layers 14_2 may extend through the first and second insulating spacers 17_1 and 17_2 in the first direction X, as illustrated in FIG. 2.

Additionally, the second stack S2 may include a second conductive contact 16_2 that may be between the first and second insulating spacers 17_1 and 17_2 and may contact the second nano-semiconductor layers 14_2 (e.g., middle portions of the second nano-semiconductor layers 14_2 in the first direction X, as illustrated in FIG. 2). The second conductive contact 16_2 may be a metallic layer including metal element(s) (e.g., W, Al and/or Cu), and no insulating layer may be present between the second conductive contact 16_2 and the second nano-semiconductor layers 14_2.

In some embodiments, the second conductive contact 16_2 and the first conductive contact 16_1 may include the same material(s). Although FIG. 2 illustrates that an upper surface of the second conductive contact 16_2 contacts a lower surface of the first conductive contact 16_1, in some embodiments, the second conductive contact 16_2 and the first conductive contact 16_1 may be separated from each other by an insulating material provided therebetween. As used herein, a lower surface of an element may refer to a surface facing a substrate (e.g., the substrate 10 in FIG. 2), and an upper surface of the element may be opposite the lower surface thereof.

The second conductive contact 16_2 may be spaced apart from the first and second insulating spacers 17_1 and 17_2 in the first direction X. In some embodiments, the contact insulator 20 may be provided between the second conductive contact 16_2 and the first and second insulating spacers 17_1 and 17_2, as illustrated in FIG. 2. In some embodiments, the second nano-semiconductor layers 14_2 may extend through the second conductive contact 16_2 in the first direction X.

In some embodiments, the second stack S2 may not be used as an electrical device (e.g., a transistor, a diode, a resistor or a capacitor) and may be referred to as a dummy stack or a dummy element. No conductive element (e.g., a conductive contact or a conductive wire) may be electrically connected to the third and fourth semiconductor regions 12_3 and 12_4. Although not shown in FIG. 2, insulating material(s) may be formed between adjacent conductive elements (e.g., between the first and third semiconductor regions 12_1 and 12_3, between the second and fourth semiconductor regions 12_2 and 12_4, between the substrate 10 and the third semiconductor region 12_3, and between the first plug 22 and the second plug 24_1) of the first stacked structure SS1. In some embodiments, insulating material(s) may contact an entire upper surface and/or an entire lower surface of the third semiconductor region 12_3 and may contact an entire upper surface and/or an entire lower surface of the fourth semiconductor region 12_4.

In some embodiments, the first nano-semiconductor layers 14_1 and the second nano-semiconductor layers 14_2 may overlap each other in the third direction Z, the first semiconductor region 12_1 and the third semiconductor region 12_3 may overlap each other in the third direction Z, and the second semiconductor region 12_2 and the fourth semiconductor region 12_4 may overlap each other in the third direction Z, as illustrated in FIG. 2. As used herein, "an element A and an element B that overlap each other in a direction X" (or similar language) may mean that at least one line can be drawn that intersects both elements A and B and extends in the direction X.

The first stacked structure SS1 may further include first and second capping layers 19_1 and 19_2 that may be provided on the first and second vertical semiconductor layers 15_1 and 15_2, respectively.

FIG. 2 illustrates that some elements (e.g., the first and second insulating spacers 17_1 and 17_2) of the second stack S2 contact the substrate 10. In some embodiments, however, a structure including one or more layers may be present between the second stack S2 and the substrate 10, and the second stack S2 may be spaced apart from the substrate 10 in the third direction Z.

Still referring to FIGS. 1 and 2, the first transistor structure TS1 may include a first transistor T1 including first channel layers 114_1 stacked in the third direction Z and may include a second transistor T2 including second channel layers 114_2 stacked in the third direction Z. The first transistor T1 and the second transistor T2 may be transistors having different conductivity types, and the first transistor structure TS1 may be a complementary metal-oxide-semiconductor (CMOS) transistor.

The first transistor T1 may also include first and second source/drain regions 112_1 and 112_2 that may be spaced apart from each other in the first direction X and may have the first conductivity type. The first and second source/drain regions 112_1 and 112_2 and the first and second semiconductor regions 12_1 and 12_2 may have the same conductivity type. The first channel layers 114_1 may include respective first side surfaces facing the first source/drain region 112_1 and respective second side surfaces facing the second source/drain region 112_2.

Further, the first transistor T1 may include first and second semiconductor spacers 115_1 and 115_2. The first semiconductor spacer 115_1 may contact the first source/drain region 112_1 and the first channel layers 114_1 (e.g., the first side surfaces of the first channel layers 114_1), and the second semiconductor spacer 115_2 may contact the second source/drain region 112_2 and the first channel layers 114_1 (e.g., the second side surfaces of the first channel layers 114_1), as illustrated in FIG. 2.

In some embodiments, the first channel layers 114_1 and the first and second semiconductor spacers 115_1 and 115_2 may include the same semiconductor material(s) (e.g., Si, Ge, SiGe, GaP, GaAs, SiC, SiGeC and/or InP). For example, each of the first channel layers 114_1 and the first and second semiconductor spacers 115_1 and 115_2 may be a silicon layer. The first channel layers 114_1 may include a dopant (e.g., B, P or As). The first and second semiconductor spacers 115_1 and 115_2 may not include any dopant. In some embodiments, the first and second semiconductor spacers 115_1 and 115_2 may include the dopant diffused from the first channel layers 114_1 and may have a dopant concentration much lower than a dopant concentration in the first channel layers 114_1. For example, the dopant concentration in the first and second semiconductor spacers 115_1 and 115_2 may be less than 10% (e.g., 5%, 1%, 0.5% or 0.1%) of the dopant concentration in the first channel layers 114_1.

When the first channel layers 114_1 and the first and second semiconductor spacers 115_1 and 115_2 include the same semiconductor material, a visible interface between the first channel layers 114_1 and the first and second semiconductor spacers 115_1 and 115_2 may not be present. For simplicity of illustration, however, that interface is shown in FIG. 2 with a dotted line.

The first transistor T1 may include a first gate structure that may include a first gate electrode 116_1 and a first gate insulator 118_1. The first gate structure maybe between the first and second semiconductor spacers 115_1 and 115_2. The first channel layers 114_1 may extend through the first gate electrode 116_1 in the first direction X, and the first gate insulator 118_1 may be provided between the first gate electrode 116_1 and the first channel layers 114_1 for electrical isolation therebetween. The first gate insulator 118_1 may contact the first channel layers 114_1 and the first and second semiconductor spacers 115_1 and 115_2.

In some embodiments, the first gate electrode 116_1 may include the metallic layer that the first conductive contact 16_1 includes and may additionally include work function layer(s) (e.g., a TiN layer, a TaN layer, a TiAl layer, a TiC layer, a TiAlC layer, a TiAlN layer and/or a WN layer). The work function layer(s) may be provided between the metallic layer and the first gate insulator 118_1. Additionally, the first transistor T1 may include a gate contact 122 that may be electrically connected to the first gate electrode 116_1, first and second source/drain contacts 124_1 and 124_2 that may be electrically connected to the first and second source/drain regions 112_1 and 112_2, respectively. In some embodiments, the gate contact 122 may contact the first gate electrode 116_1, and the first and second source/drain contacts 124_1 and 124_2 may contact the first and second source/drain regions 112_1 and 112_2, respectively.

The second transistor T2 may include third and fourth source/drain regions 112_3 and 112_4 that may be spaced apart from each other in the first direction X and may have the second conductivity type. The third and fourth source/drain regions 112_3 and 112_4 and the third and fourth semiconductor regions 12_3 and 12_4 may have the same conductivity type. The second channel layers 114_2 may be between the third and fourth source/drain regions 112_3 and 112_4 and may include respective first side surfaces contacting the third source/drain region 112_3 and respective second side surfaces contacting the fourth source/drain region 112_4.

Further, the second transistor T2 may include first and second transistor insulating spacers 117_1 and 117_2 that may contact the third and fourth source/drain regions 112_3 and 112_4 (e.g., side surfaces of the third and fourth source/drain regions 112_3 and 112_4), respectively. In some embodiments, the second channel layers 114_2 may extend through the first and second transistor insulating spacers 117_1 and 117_2 in the first direction X as illustrated in FIG. 2.

Additionally, the second transistor T2 may include a second gate structure that may include a second gate electrode 116_2 and a second gate insulator 118_2. The second gate structure may be between the first and second transistor insulating spacers 117_1 and 117_2. The second channel layers 114_2 may extend through the second gate electrode 116_2 in the first direction X, and the second gate insulator 118_2 may be provided between the second gate electrode 116_2 and the second channel layers 114_2 for electrical isolation therebetween. The second gate insulator 118_2 may contact the second channel layers 114_2 and the first and second transistor insulating spacers 117_1 and 117_2, as illustrated in FIG. 2.

Each of the first and second gate insulators 118_1 and 118_2 may include a silicon oxide layer and/or a high-k material layer. The high-k material layer may include $Al_2O_3$, $HfO_2$, $ZrO_2$, $HfZrO_4$, $TiO_2$, $Sc_2O_3Y_2O_3$, $La_2O_3$, $Lu_2O_3$, $Nb_2O_5$ or $Ta_2O_5$.

In some embodiments, the first and second gate electrodes 116_1 and 116_2 may include the same material(s). Although FIG. 2 illustrates that an upper surface of the second gate electrode 116_2 contacts a lower surface of the first gate electrode 116_1, in some embodiments, the first and second gate electrodes 116_1 and 116_2 may be separated from each other by an insulating material provided therebetween.

In some embodiments, the first source/drain contact 124_1 may also be electrically connected to the third source/drain region 112_3. The first source/drain contact 124_1 may also contact the third source/drain region 112_3. The first transistor stack TS1 may also include a third source/drain contact 124_3 that may be electrically connected to the fourth source/drain region 112_4. The third source/drain contact 124_3 may contact the fourth source/drain region 112_4, as illustrated in FIG. 2.

The second transistor structure TS2 may further include first and second transistor capping layers 119_1 and 119_2 that may be provided on the first and second semiconductor spacers 115_1 and 115_2, respectively.

In some embodiments, the first channel layers 114_1 and the second channel layers 114_2 may overlap each other in the third direction Z, the first source/drain region 112_1 and the third source/drain region 112_3 may overlap each other in the third direction Z, and the second source/drain region 112_2 and the fourth source/drain region 112_4 may overlap each other in the third direction Z, as illustrated in FIG. 2.

FIG. 2 illustrates that some elements (e.g., the first and second transistor insulating spacers 117_1 and 117_2) of the second transistor T2 contact the substrate 10. In some embodiments, however, a structure including one or more layers may be present between the second transistor T2 and the substrate 10, and the second transistor T2 may be spaced apart from the substrate 10.

Referring to FIG. 1, the first and second nano-semiconductor layers 14_1 and 14_2 may have a first width W1 in the first direction X, and the first and second channel layers 114_1 and 114_2 may have a second width W2 in the first direction X. The first width W1 may be wider than the second width W2. When the first and second nano-semiconductor layers 14_1 and 14_2 have different widths in the first direction X, the first width W1 refers to a widest width among widths of the first and second nano-semiconductor layers 14_1 and 14_2, and when the first and second channel layers 114_1 and 114_2 have different widths in the first direction X, the second width W2 refers to a widest width among widths of the first and second channel layers 114_1 and 114_2.

In some embodiments, the first and second conductive contacts 16_1 and 16_2 may be formed by filling a conductive material in a space that has a third width W3 in the first direction X and is defined in the contact insulator 20. When the first width W1 is wider than the second width W2, the third width W3 may be wide enough to allow filling of the conductive material in that space without defects (e.g., a cavity) despite the contact insulator 20 being additionally present in the first stacked structure SS1. For example, the third width W3 may be similar to the second width W2.

In some embodiments, the first nano-semiconductor layers 14_1 and the first channel layers 114_1 may have the same thickness (i.e., a first thickness TH1) in the third direction Z. Two adjacent first nano-semiconductor layers 14_1 may be spaced apart from each other in the third direction Z by the same distance (i.e., a first distance D1) as a distance between two adjacent first channel layers 114_1 in the third direction Z. Further, a lowest first nano-semiconductor layer 14_1 and a lowest first channel layer 114_1 may be provided at the same height (i.e., a first height H1) from the first surface 10_1 of the substrate 10. In some embodiments, the first nano-semiconductor layers 14_1 and the first channel layers 114_1 may be formed by the same processes (e.g., the same deposition process and/or the same patterning processes). For example, an uppermost first nano-semiconductor layer 14_1 and an uppermost first channel layer 114_1 may be formed by patterning a single semiconductor layer and may be different portions of that single semiconductor layer.

In some embodiments, the second nano-semiconductor layers 14_2 and the second channel layers 114_2 may have the same thickness (i.e., a second thickness TH2) in the third direction Z. Two adjacent second nano-semiconductor layers 14_2 may be spaced apart from each other in the third direction Z by the same distance (i.e., a second distance D2) as a distance between two adjacent second channel layers 114_2 in the third direction Z. Further, a lowest second nano-semiconductor layer 14_2 and a lowest second channel layer 114_2 may be provided at the same height (i.e., a second height H2) from the first surface 10_1 of the substrate 10. In some embodiments, the second nano-semiconductor layers 14_2 and the second channel layers 114_2 may be formed by the same processes (e.g., the same deposition process and/or the same patterning processes). For example, an uppermost second nano-semiconductor layer 14_2 and an uppermost second channel layer 114_2 may be formed by patterning a single semiconductor layer and may be different portions of that single semiconductor layer.

The first and second semiconductor regions 12_1 and 12_2 and the first and second source/drain regions 112_1 and 112_2 may include the same material(s) (e.g., one or more semiconductor materials such as Si, Ge, SiGe, GaP, GaAs, SiC, SiGeC and/or InP). In some embodiments, the first and second semiconductor regions 12_1 and 12_2 and the first and second source/drain regions 112_1 and 112_2 may be formed concurrently by, for example, the same epitaxial growth process. The third and fourth semiconductor regions 12_3 and 12_4 and the third and fourth source/drain regions 112_3 and 112_4 may include the same material(s) (e.g., one or more semiconductor materials such as Si, Ge, SiGe, GaP, GaAs, SiC, SiGeC and/or InP). In some embodiments, the third and fourth semiconductor regions 12_3 and 12_4 and the third and fourth source/drain regions 112_3 and 112_4 may be formed concurrently by, for example, the same epitaxial growth process. As used herein, "formed concurrently" refers to being formed in a same fabrication step, at approximately (but not necessarily exactly) the same time.

The first nano-semiconductor layers 14_1 and the first channel layers 114_1 may include the same material(s), and the second nano-semiconductor layers 14_2 and the second channel layers 114_2 may include the same material(s). The first and second nano-semiconductor layers 14_1 and 14_2 and the first and second channel layers 114_1 and 114_2 may include semiconductor material(s) (e.g., Si, Ge, SiGe, GaP, GaAs, SiC, SiGeC and/or InP). In some embodiments, each of the first and second nano-semiconductor layers 14_1 and 14_2 and the first and second channel layers 114_1 and 114_2 may be a nanosheet that may have a thickness in a range of from 1 nm to 100 nm in the third direction Z or may be a nanowire that may have a circular cross-section with a diameter in a range of from 1 nm to 100 nm.

The first and second insulating spacers 17_1 and 17_2 and the first and second transistor insulating spacers 117_1 and 117_2 may include the same material(s) (e.g., silicon oxide, silicon oxynitride, silicon nitride, silicon carbonitride and/or low-k material). The first and second capping layers 19_1 and 19_2 and the first and second transistor capping layers 119_1 and 119_2 may include the same material(s) (e.g., silicon oxide, silicon oxynitride, silicon nitride, silicon carbonitride and/or low-k material). The contact insulator 20 may include, for example, silicon oxide, silicon oxynitride, silicon nitride, silicon carbonitride and/or low-k material.

Each of the first plug 22, the second and third plugs 24_1 and 24_2, the gate contact 122, the first, second and third source/drain contacts 124_1, 124_2 and 124_3 may include metal layer(s) (e.g., a copper layer, a tungsten layer, a cobalt layer and/or an aluminum layer).

Figure 3:
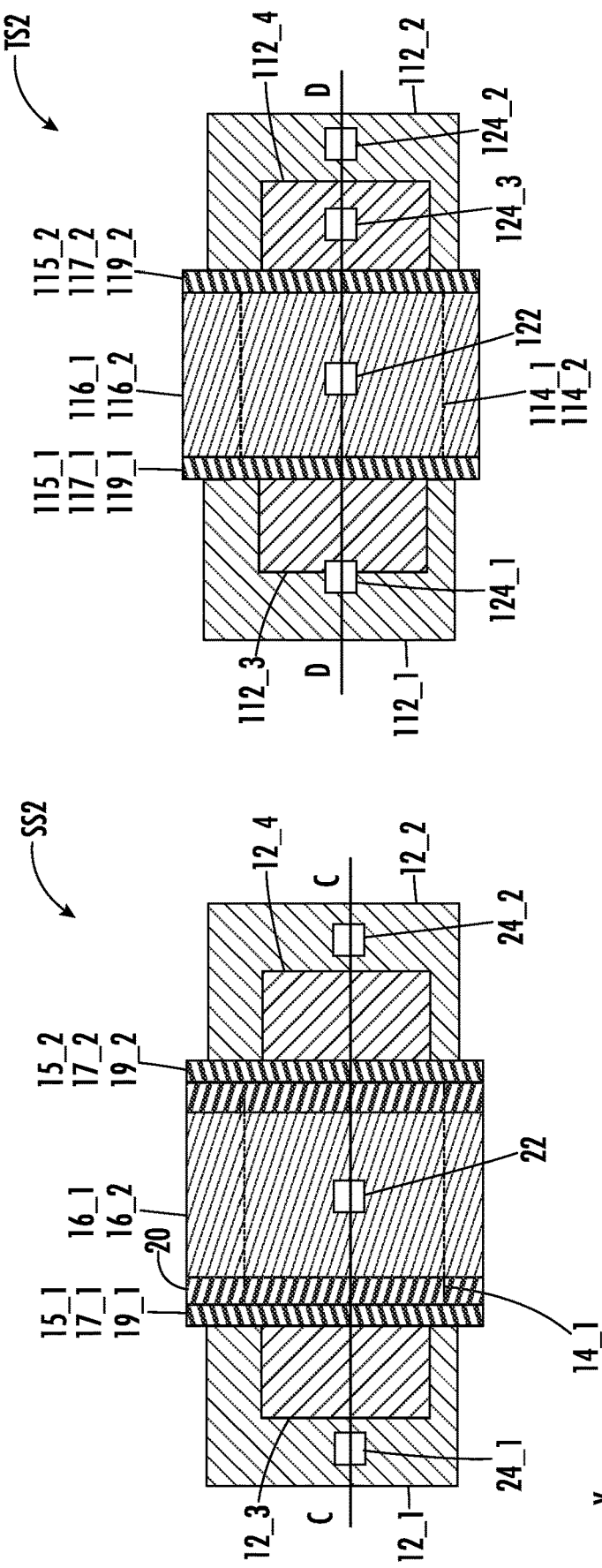
FIG. 3 is a layout of an integrated circuit device according to some embodiments.
Figure 4:
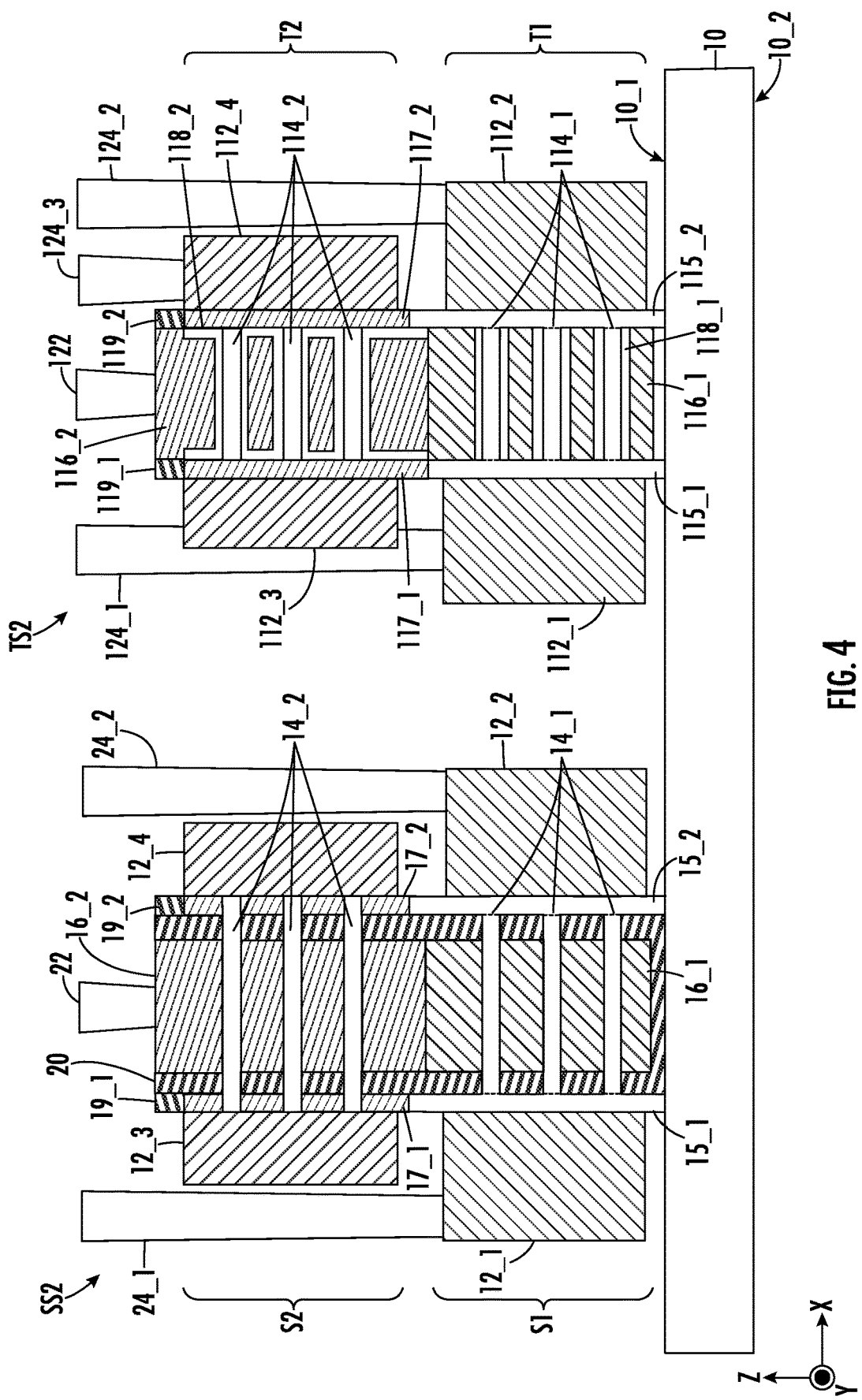
FIG. 4 shows cross-sectional views taken along the lines C-C and D-D in FIG. 3, according to some embodiments.

FIG. 3 is a layout of an integrated circuit device including a second stacked structure SS2 and a second transistor structure TS2, according to some embodiments. FIG. 4 shows a cross-sectional view of the second stacked structure SS2 taken along the line C-C in FIG. 3 and a cross-sectional view of the second transistor structure TS2 taken along the line D-D in FIG. 3, according to some embodiments.

The second stacked structure SS2 is similar to the first stacked structure SS1 described with reference to FIGS. 1 and 2 with a primary difference being that the first stack S1 is between the substrate 10 and the second stack S2. The second transistor structure TS2 is also similar to the first transistor structure TS1 described with reference to FIGS. 1 and 2 with a primary difference being that the first transistor T1 is between the substrate 10 and the second transistor T2.

Figure 5:
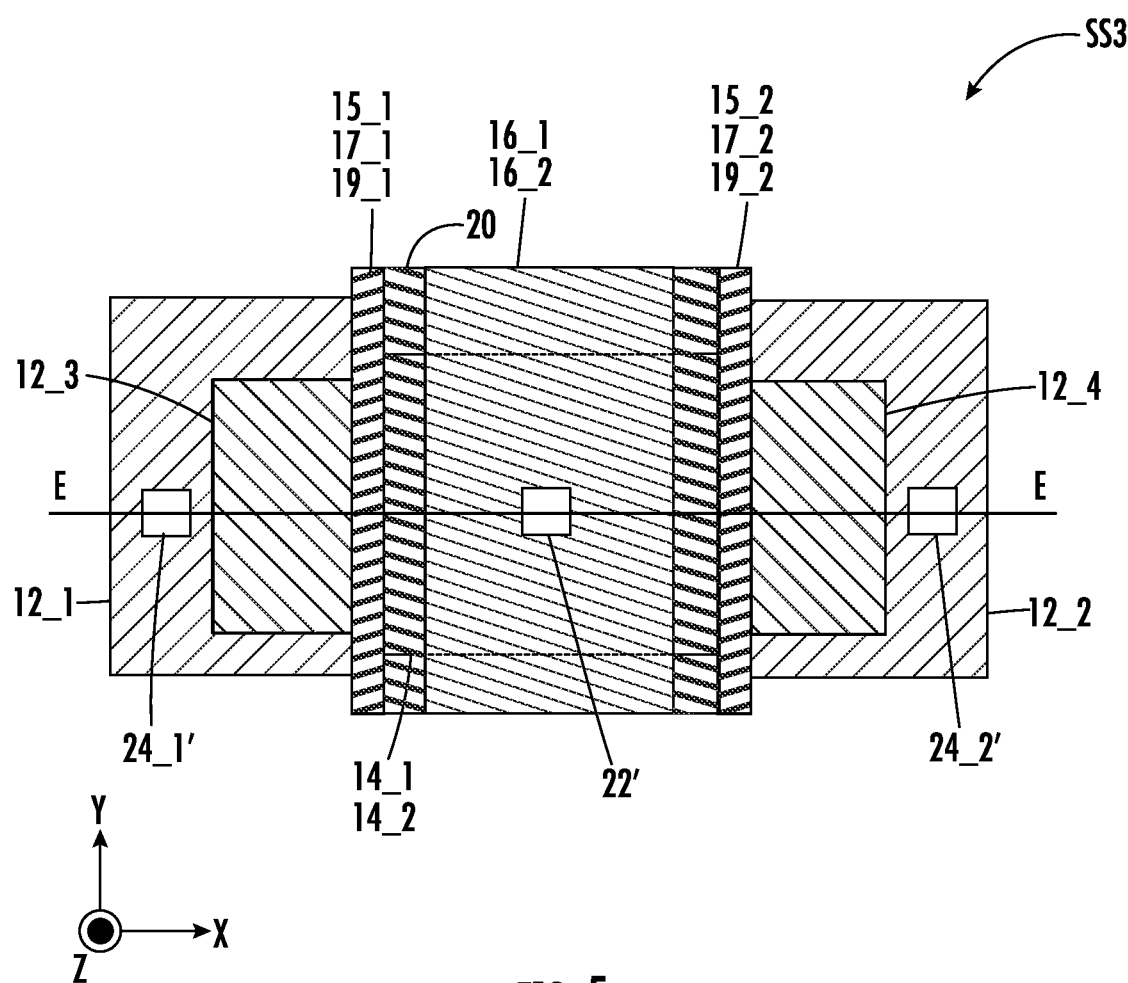
FIG. 5 is a layout of an integrated circuit device according to some embodiments.
Figure 6:
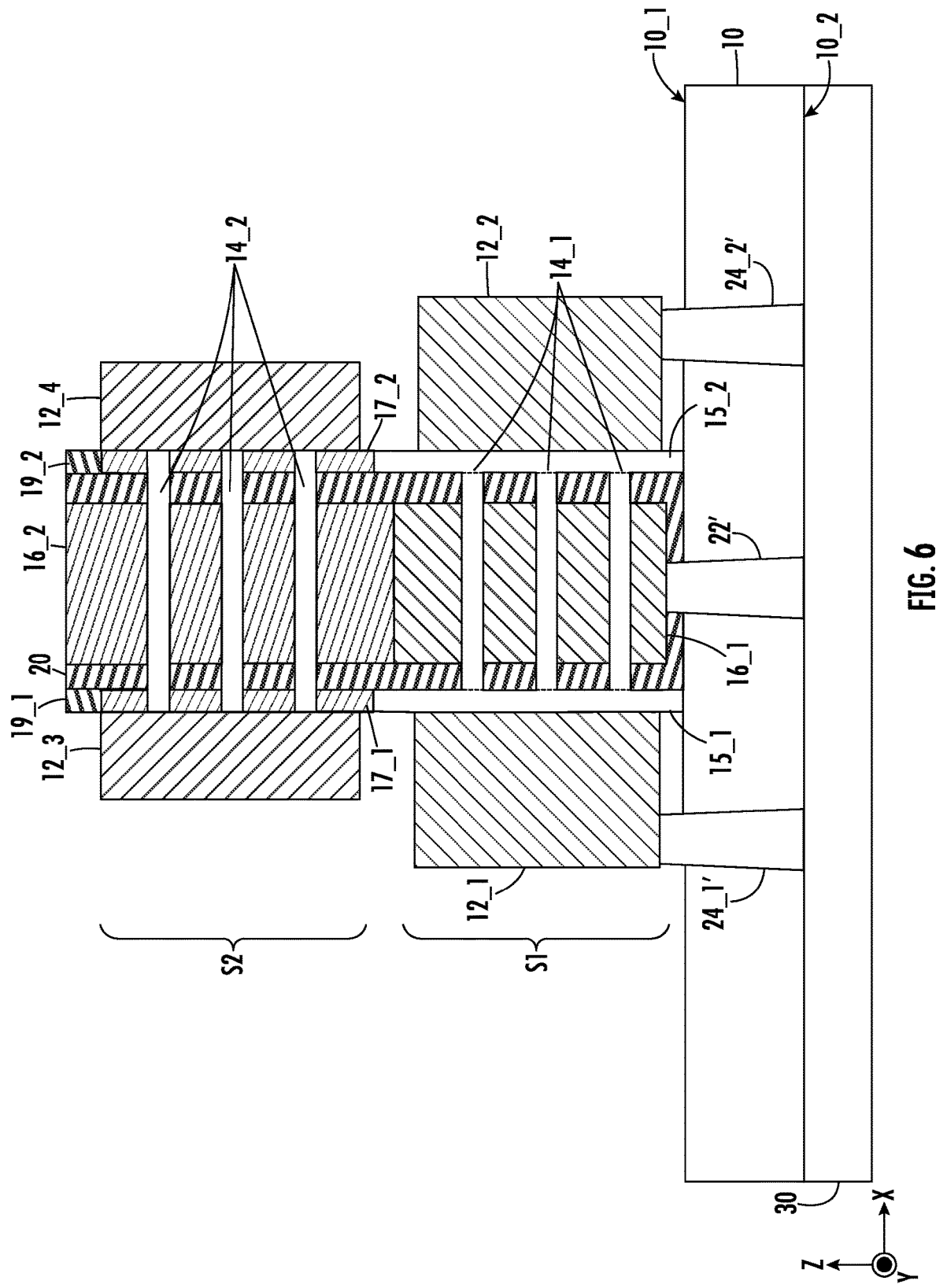
FIG. 6 shows a cross-sectional view taken along the line E-E in FIG. 5, according to some embodiments.

FIG. 5 is a layout of a third stacked structure SS3, according to some embodiments, and FIG. 6 is a cross-sectional view of the third stacked structure SS3 taken along the line E-E in FIG. 5, according to some embodiments.

The third stacked structure SS3 is similar to the second stacked structure SS2 illustrated in FIGS. 3 and 4 with a primary difference being that a first plug 22' (also referred to as a connection contact) and second and third plugs 24_1' and 24_2' are provided in the substrate 10. The first plug 22' may be electrically connected to the first nano-semiconductor layers 14_1 through the first conductive contact 16_1.

The first plug 22' and the second and third plugs 24_1' and 24_2' may be connected to conductive elements (e.g., a via contact and/or a wire) of a back side power distribution network (BSPDN) 30 that is provided on the second surface 10_2 of the substrate 10. The BSPDN 30 may include insulating layers stacked on the second surface 10_2 of the substrate 10 and conductive elements provided therein.

BJT transistors and/or P-N junction diodes according to some embodiments described herein may provide a number of advantages. For example, an electrical current flows through multiple regions (e.g., the first nano-semiconductor layers 14_1 in FIG. 2) that are connected in parallel. Therefore, current variation may be reduced. Further, regions (e.g., the first nano-semiconductor layers 14_1 in FIG. 2) through which an electrical current flow may have respective widths (e.g., the first width W1 in FIG. 1) that can be changed independently of a width (e.g., the second width W2 in FIG. 1) of a channel region (e.g., the first channel layers 114_1 in FIG. 2). Accordingly, BJT transistors and P-N junction diodes having different performance parameters (e.g., an amount of current) can be formed in a single device.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device including a bipolar junction transistor (BJT) and/or a P-N junction diode, the integrated circuit device comprising:
   a first stack comprising:
      first and second semiconductor regions that are spaced apart from each other in a horizontal direction and have a first conductivity type;
      a plurality of nano-semiconductor layers that are stacked in a vertical direction and are between the first and second semiconductor regions, wherein the plurality of nano-semiconductor layers each have a second conductivity type different from the first conductivity type, and the first semiconductor region comprises a side surface facing the plurality of nano-semiconductor layers;
      a vertical semiconductor layer having the second conductivity type, wherein the vertical semiconductor layer contacts the side surface of the first semiconductor region and the plurality of nano-semiconductor layers; and
      a conductive contact that directly contacts the plurality of nano-semiconductor layers.

2. The integrated circuit device of claim 1, wherein the conductive contact is spaced apart from the vertical semiconductor layer.

3. The integrated circuit device of claim 1, further comprising a contact insulator that separates the conductive contact from the vertical semiconductor layer.

4. The integrated circuit device of claim 1, wherein the plurality of nano-semiconductor layers extend through the conductive contact in the horizontal direction.

5. The integrated circuit device of claim 1, wherein the plurality of nano-semiconductor layers and the vertical semiconductor layer comprise the same semiconductor material.

6. The integrated circuit device of claim 5, wherein the plurality of nano-semiconductor layers and the vertical semiconductor layer comprise the same dopant.

7. The integrated circuit device of claim 1, further comprising:
a substrate; and
a connection contact that is in the substrate and is electrically connected to the conductive contact.

8. The integrated circuit device of claim 1, wherein the first semiconductor region is a first conductivity type region of the BJT or the P-N junction diode, and
the plurality of nano-semiconductor layers and the vertical semiconductor layer are collectively a second conductivity type region of the BJT or the P-N junction diode.

9. The integrated circuit device of claim 1, wherein the second semiconductor region comprises a side surface facing the plurality of nano-semiconductor layers, and
wherein the vertical semiconductor layer is a first vertical semiconductor layer, and the first stack further comprises a second vertical semiconductor layer that contacts the side surface of the second semiconductor region and the plurality of nano-semiconductor layers.

10. The integrated circuit device of claim 9, wherein the plurality of nano-semiconductor layers and the first and second vertical semiconductor layers comprise the same semiconductor material.

11. The integrated circuit device of claim 9, wherein the conductive contact is spaced apart from the first and second vertical semiconductor layers.

12. The integrated circuit device of claim 9, wherein the first and second semiconductor regions are an emitter and a collector of the BJT, respectively, and
the plurality of nano-semiconductor layers and the first and second vertical semiconductor layers are collectively a base of the BJT.

13. The integrated circuit device of claim 1, wherein the plurality of nano-semiconductor layers are a plurality of first nano-semiconductor layers, and
the integrated circuit device further comprises a second stack comprising:
third and fourth semiconductor regions that are spaced apart from each other in the horizontal direction and each have the second conductivity type; and
a plurality of second nano-semiconductor layers that are stacked in the vertical direction and are between the third and fourth semiconductor regions, wherein the plurality of second nano-semiconductor layers comprise respective first side surfaces contacting the third semiconductor region and respective second side surfaces contacting the fourth semiconductor region.

14. The integrated circuit device of claim 13, wherein the conductive contact is a first conductive contact, and
the second stack further comprises a second conductive contact that is between the third and fourth semiconductor regions and contacts the plurality of second nano-semiconductor layers.

15. The integrated circuit device of claim 13, wherein the first side surfaces of the plurality of second nano-semiconductor layers contact a side surface of the third semiconductor region, and
the integrated circuit device further comprises an insulating spacer that contacts the side surface of the third semiconductor region, and the plurality of second nano-semiconductor layers extend through the insulating spacer in the horizontal direction.

16. The integrated circuit device of claim 13, wherein the integrated circuit device further comprises a substrate, and the first stack is between the substrate and the second stack, and
the integrated circuit device further comprises a connection contact that is in the substrate and is electrically connected to the plurality of first nano-semiconductor layers.

17. The integrated circuit device of claim 13, wherein the plurality of first nano-semiconductor layers and the plurality of second nano-semiconductor layers overlap each other in the vertical direction.

18. The integrated circuit device of claim 13, wherein the first and third semiconductor regions overlap each other in the vertical direction.

19. The integrated circuit device of claim 1, wherein the first stack comprises the BJT or the P-N junction diode, and the first stack is stacked with a dummy element.

20. The integrated circuit device of claim 19, wherein the integrated circuit device further comprises a substrate, and the dummy element is between the first stack and the substrate.

* * * * *